(12) United States Patent
Cheng et al.

(10) Patent No.: US 11,336,106 B2
(45) Date of Patent: May 17, 2022

(54) CHARGING SYSTEM WITH LOW POWER CONSUMPTION

(71) Applicant: Realtek Semiconductor Corp., HsinChu (TW)

(72) Inventors: Hung-Hsuan Cheng, Chiayi (TW); Shih-Chieh Chen, Yilan County (TW); Cheng-Lin Huang, Kaohsiung (TW); Chun-Yu Luo, Taoyuan (TW); Yi-Lin Li, Hsinchu (TW); Liang-Hui Li, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 184 days.

(21) Appl. No.: 16/292,174

(22) Filed: Mar. 4, 2019

(65) Prior Publication Data

US 2019/0280486 A1 Sep. 12, 2019

Related U.S. Application Data

(60) Provisional application No. 62/639,504, filed on Mar. 7, 2018.

(30) Foreign Application Priority Data

Nov. 28, 2018 (TW) ................... 107142370

(51) Int. Cl.
*H02J 7/00* (2006.01)
*H01M 10/44* (2006.01)
*G01R 19/165* (2006.01)
*H02J 7/34* (2006.01)

(52) U.S. Cl.
CPC ........ *H02J 7/007* (2013.01); *G01R 19/16542* (2013.01); *H01M 10/44* (2013.01); *H02J 7/00041* (2020.01); *H02J 7/00714* (2020.01); *H02J 7/007182* (2020.01); *H02J 7/342* (2020.01); *H02J 7/00712* (2020.01)

(58) Field of Classification Search
CPC ...... H02J 7/007; H02J 7/007182; H02J 7/342; H02J 7/00712; H02J 7/008; H02J 7/0054; H02J 7/00041; H02J 7/00714; H01M 10/44; G01R 19/16542; Y02E 60/10
USPC .................. 320/103, 108, 161–162; 307/104
See application file for complete search history.

(56) References Cited

U.S. PATENT DOCUMENTS

2010/0231175 A1\* 9/2010 Noda ................... H02J 7/00712
320/162
2014/0191033 A1\* 7/2014 Wojcik ..................... H02J 7/007
235/449
2015/0162771 A1\* 6/2015 Monden .................. H02J 7/007
320/103

FOREIGN PATENT DOCUMENTS

TW 201806284 A 2/2018

\* cited by examiner

*Primary Examiner* — Zixuan Zhou
(74) *Attorney, Agent, or Firm* — Winston Hsu

(57) ABSTRACT

A charging system includes: an input voltage supply circuit; a control circuit coupled to the input voltage supply circuit, configured to control the input voltage supply circuit to generate an input voltage according to a battery voltage of a target battery; and a charging circuit, coupled to the control circuit, configured to receive the input voltage and to provide a charging current to charge the target battery. The input voltage is generated according to a function that takes the battery voltage as a parameter. The input voltage is positively correlated with the battery voltage, and is greater than the battery voltage.

8 Claims, 4 Drawing Sheets

CHARGING SYSTEM WITH LOW POWER CONSUMPTION

CROSS REFERENCE TO RELATED APPLICATIONS

This application claims the benefit of the U.S. provisional application No. 62/639,504 filed on Mar. 7, 2018. The contents of the above-mentioned applications are all hereby incorporated by reference.

BACKGROUND OF THE INVENTION

1. Field of the Invention

The present invention relates to a charging system, and more particularly, to a charging system capable of reducing the power consumption of the charging circuit and the heat generated by the charging circuit.

2. Description of the Prior Art

Due to the prevalence of portable electronic devices (e.g. smartphones, tablets, etc.), how to improve the charging system for charging the battery of the portable electronic device has become an important issue. Please refer to FIG. 1, which is a block diagram illustrating a related art charging system. As shown in FIG. 1, the related art charging system 100 comprises an input voltage supply circuit 101 and a charging circuit 103. The input voltage supply circuit 101 is configured to provide the input voltage V_in. The charging circuit 103 receives the input voltage V_in, and generates the charging current I_cha according to the input voltage V_in in order to charge the battery 105. The battery voltage V_BAT rises with the duration of charging the battery 105. In general, the input voltage V_in is a fixed value (e.g. 5V). Hence, when the battery voltage V_BAT is small, the voltage difference between the input voltage V_in and the battery voltage V_BAT at the both ends of the charging circuit 103 will be quite large. In this situation, a greater current will flow through the equivalent resistor (which is generated by the transistor) of the charging circuit 103, resulting in huge power consumption and causing the charging circuit 103 to overheat.

SUMMARY OF THE INVENTION

Therefore, an objective of the present invention is to provide a charging system capable of reducing the power consumption of the charging circuit and heat generated by the charging circuit.

Another objective of the present invention is to provide a portable electronic system capable of reducing the power consumption and overheat problem of the charging circuit.

An embodiment of the present invention discloses a charging system which comprises an input voltage supply circuit, a control circuit and a charging circuit. The control circuit is coupled to the input voltage supply circuit, the control circuit configured to control the input voltage supply circuit to generate an input voltage according to a battery voltage of a target battery. The charging circuit is coupled to the control circuit, the charging circuit configured to receive the input voltage and to provide a charging current to charge the target battery. The input voltage is generated according to a function that takes the battery voltage as a parameter, and the input voltage is positively correlated with the battery voltage and is greater than the battery voltage.

An embodiment of the present invention discloses a portable electronic system which comprises a battery box and a portable electronic device. The battery box comprises: an input voltage supply circuit; a power supply battery coupled to the input voltage supply circuit; and a control circuit coupled to the input voltage supply circuit, and configured to control the input voltage supply circuit to obtain power stored in the power supply battery according to the battery voltage of a target battery. The portable electronic device comprises the target battery and comprises: a charging circuit coupled to the control circuit, and configured to receive the input voltage and provide a charging current to charge the target battery. The input voltage is generated according to a function which takes the battery voltage as a parameter, and the input voltage is positively correlated with the battery voltage and the input voltage is greater than the battery voltage.

Based on the above embodiments, the charging system provided by the present invention may reduce the voltage difference between the both ends of the charging circuit to further reduce the power consumption of the charging circuit and the heat generated by the charging circuit. When applied in a portable electronic system comprising a battery box, the charging system provided by the present invention may efficiently transfer the power stored in the battery box to a battery to be charged (i.e. the target battery), which increases the times the battery can be fully charged by the battery.

These and other objectives of the present invention will no doubt become obvious to those of ordinary skill in the art after reading the following detailed description of the preferred embodiment that is illustrated in the various figures and drawings.

DETAILED DESCRIPTION

The following embodiments are used to illustrate the technical contents of the present invention, and the elements in the embodiments may be implemented by hardware (e.g. a circuits or device) and/or firmware (e.g. the burned-in software in a processor). In addition, the term "couple" used in the entire document may be viewed as a direct electrical connection or an indirect electrical connection between two elements.

Figure 1:
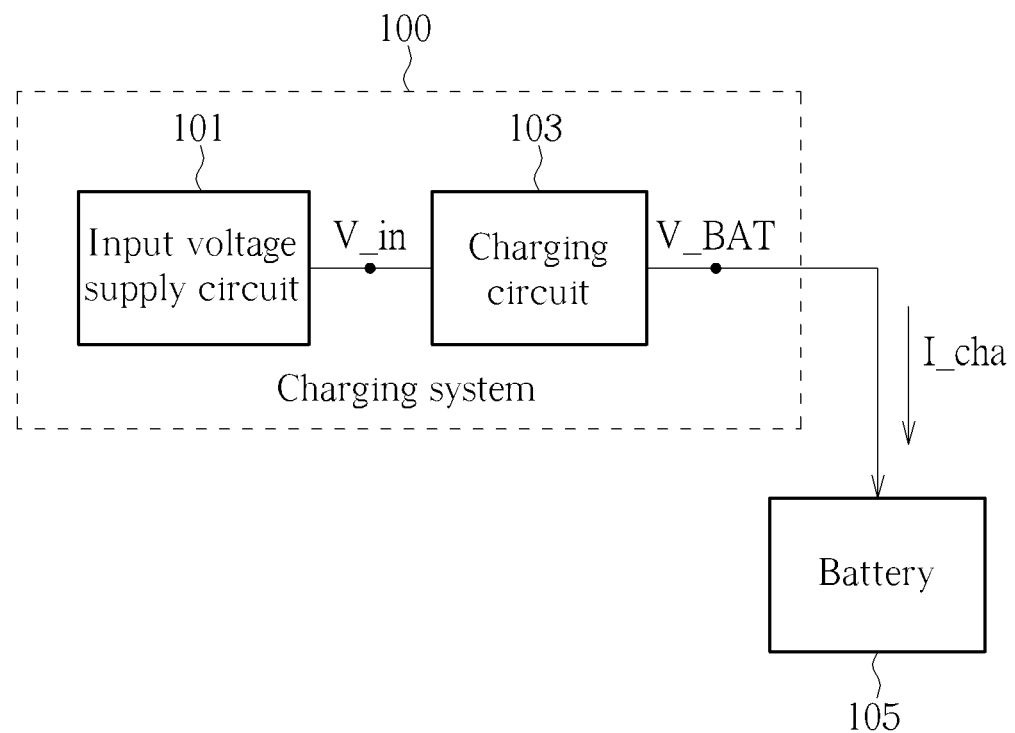
FIG. 1 is a block diagram illustrating a related art charging system.
Figure 2:
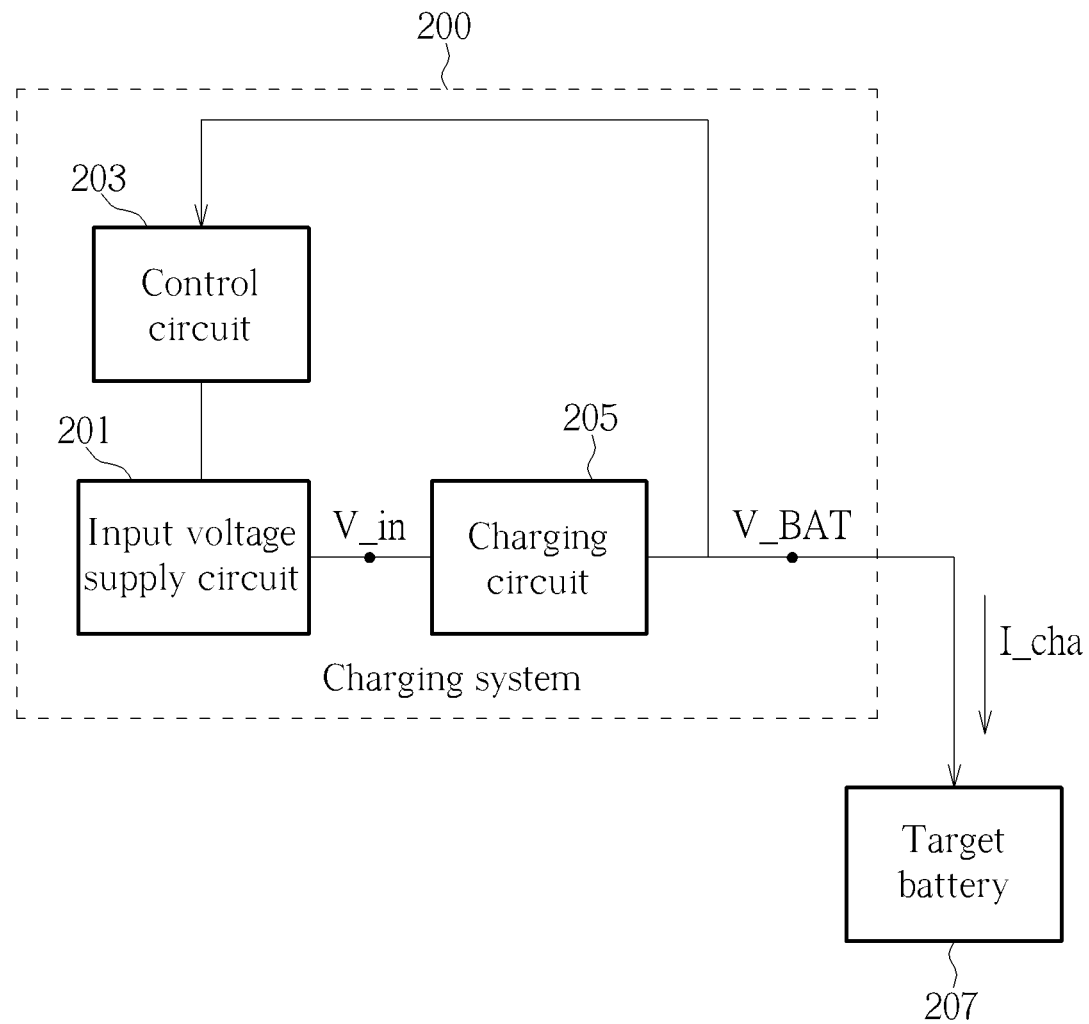
FIG. 2 is a block diagram illustrating a charging system according to an embodiment of the present invention.

A concept of the present invention is to reduce the voltage difference between the aforementioned input voltage V_in and battery voltage V_BAT, so as to improve the power consumption and the overheat issue of the charging circuit. FIG. 2 is a block diagram illustrating a charging system 200 according to an embodiment of the present invention. As shown in FIG. 2, the charging system 200 comprises an input voltage supply circuit 201, a control circuit 203, and a charging circuit 205. The control circuit 203 controls the input voltage supply circuit 201 according to a battery voltage V_BAT of a target battery 207 in order to generate an input voltage V_in. In an embodiment, the control circuit 203 is coupled to the target battery 207 so as to self-obtain the value of the battery voltage V_BAT.

The charging circuit 205 receives the input voltage V_in and accordingly provides a charging current I_cha to charge the target battery 207. The charging circuit 205 may be all kinds of charging circuits, such as a linear charging circuit or a switch charging circuit. The input voltage V_in is generated according to a function that takes the battery voltage V_BAT as a parameter. The input voltage V_in is positively correlated with the battery voltage V_BAT. That is, when the battery voltage V_BAT is greater, the input voltage V_in will also become greater, wherein the input voltage V_in is greater than the battery voltage V_BAT. In this way, the charging circuit 205 may reduce the voltage difference between the input voltage V_in and the battery voltage V_BAT when the charging circuit 205 normally operates.

In an embodiment, the aforementioned function may be presented as V_in=M×V_BAT+N×R_on×I_cha+K, wherein V_in represents the aforementioned input voltage, V_BAT represents the aforementioned battery voltage, R_on represents the equivalent resistance of the charging circuit 205, and I_cha represents the aforementioned charging current.

Figure 3:
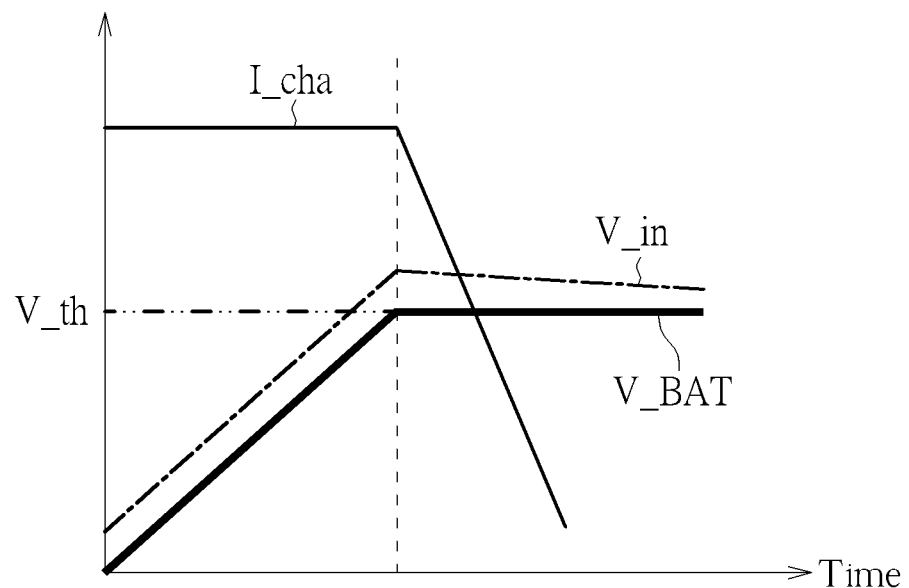
FIG. 3 is a diagram illustrating the operation of the charging system shown in FIG. 2.

FIG. 3 depicts the operational curve of the charging system 200 shown in FIG. 2 under the situation where M and N are 1 and k is 0. As shown in FIG. 3, when the battery voltage V_BAT is smaller than the threshold voltage V_th, the charging current I_cha will be a constant value, and the battery voltage V_BAT will rise in a faster rate. When the battery voltage V_BAT is greater than the threshold voltage V_th (e.g. the target battery 207 is fully charged), the charging current I_cha will drop and thereby avoid damaging the target battery 207. In this situation, the curve of the input voltage V_in shown in FIG. 3 can be obtained by referring to the above-mentioned function V_in=V_BAT+R_on×I_cha. As shown in FIG. 3, since R_on is the equivalent resistance of the charging circuit 205, it can be a fixed value. In the meantime, the charging current I_cha is a known curve, wherein the charging current I_cha is a fixed value when the battery voltage V_BAT is smaller than the threshold voltage V_th, and may become smaller when the battery voltage V_BAT is larger than the threshold voltage V_th. Hence, in the curve of the input voltage V_in, the difference between the input voltage V_in and the battery voltage V_BAT remains constant when the battery voltage V_BAT is smaller than the threshold voltage V_th, and becomes smaller and smaller when the battery voltage V_BAT is greater than threshold voltage V_th. In this way, the input voltage V_in remains positively correlated with the battery voltage V_BAT and larger than the battery voltage V_BAT until the charging current I_cha goes to zero. It should be noted that the current curve might be different than that shown in FIG. 3 if a different type of charging circuit is applied. In this way, the curves of the battery voltage V_BAT and the input voltage V_in will be different than those shown in FIG. 3.

The applied function is not limited to V_in=M×V_BAT+N×R_on×I_cha+K mentioned above. For example, in an embodiment, the function may be V_in=M×V_BAT+K, wherein M and K are positive numbers. Since the equivalent resistance of a certain type of charging circuit may fall within a known interval, using a specific equivalent resistance R_on of the charging circuit as a parameter of the function is not the only way to achieve the goal. For example, by properly setting M and K, the input voltage V_in can also be positively correlated with the battery voltage V_BAT and be larger than battery voltage V_BAT when the charging circuit 205 normally operates. Accordingly, the design of the circuit may be more flexible. Based on the same theory, in an embodiment, the function may be V_in=M×V_BAT, wherein M is a positive number larger than 1. By properly setting the value of M, the input voltage V_in can be positively correlated with the battery voltage V_BAT with the charging circuit 205 can normally operating.

Please note that the function in the present invention is not limited to the above example. As long as the input voltage V_in can still be positively correlated with the battery voltage V_BAT, the charging circuit 205 can still normally operate, and the goal of reducing the voltage difference between the input voltage V_in and the battery voltage V_BAT can still be achieved, modifications to the aforementioned function shall fall with the scope of the present invention.

The charging system 200 shown in FIG. 2 may be applied in any type of electronic devices. In an embodiment, the charging system 200 may be used to charge the battery of a portable electronic device, wherein the portable electronic device may be a portable electronic device (e.g. smartphone, tablet, etc.) or a wearable device (e.g. headset, smart glasses, smart watch, etc.).

Figure 4:
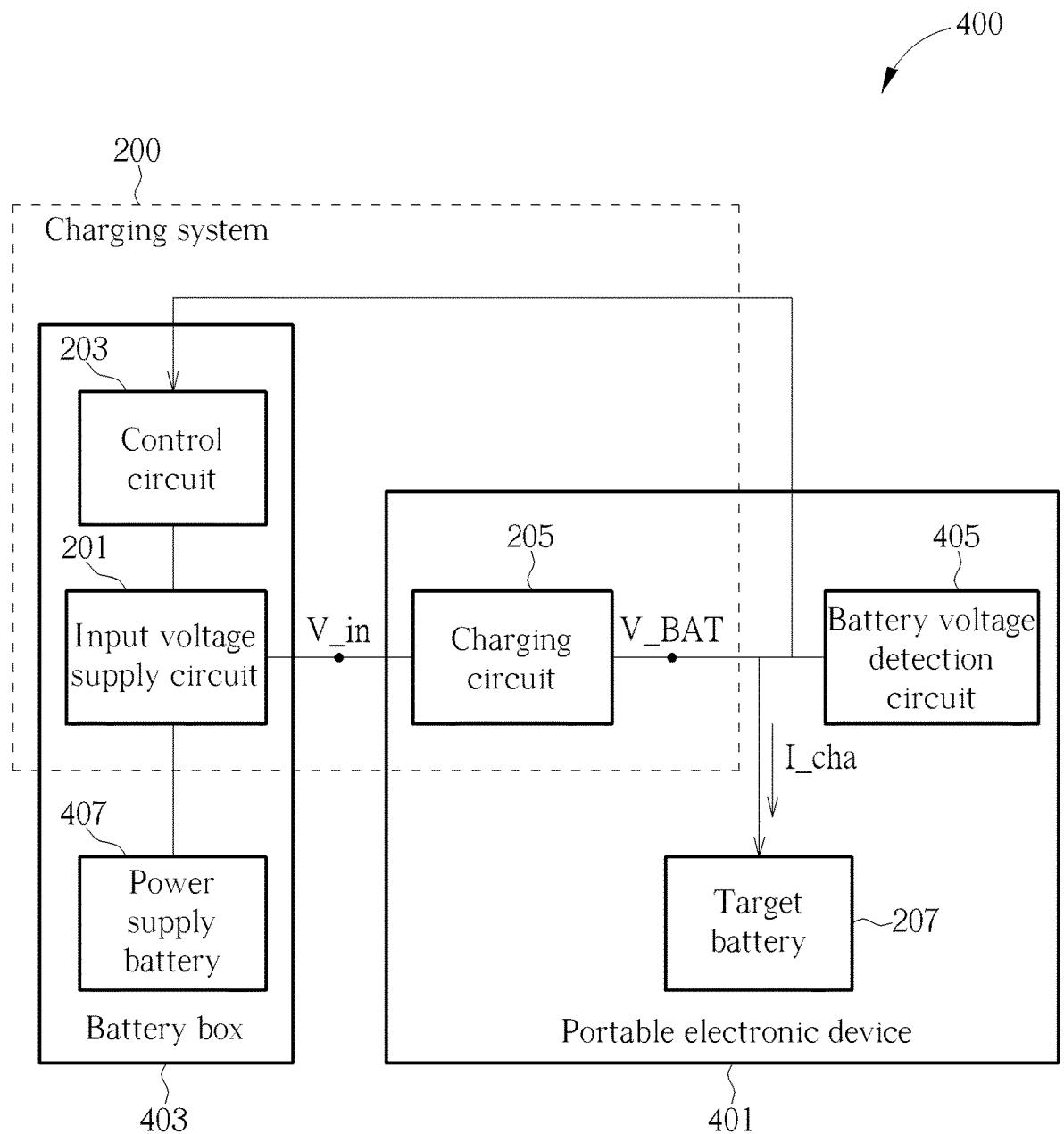
FIG. 4 is a block diagram illustrating a charging system according to another embodiment of the present invention.

FIG. 4 is a block diagram illustrating a charging system according to another embodiment of the present invention. As shown in FIG. 4, the charging system 200 may be applied to the portable electronic system 400. The portable electronic system 400 comprises a portable electronic device 401 and a battery box 403. The charging circuit 205 and the target battery 207 shown in FIG. 2 may be arranged in the portable electronic device 401, and the input voltage supply circuit 201 and the control circuit 203 shown in FIG. 2 may be arranged in the battery box 403.

In the embodiment of FIG. 4, the battery box 403 comprises a power supply battery 407, and the portable electronic device 401 comprises a battery voltage detection circuit 405. The power supply battery 407 may be an unchargeable battery (e.g. a dry cell battery), or a chargeable battery. If the power supply battery 407 is a chargeable battery, the battery box 403 may further comprise a charging circuit (not shown) to charge the power supply battery 407. The battery voltage detection circuit 405 is configured to transmit the value of the battery voltage V_BAT to the control circuit 203. In an embodiment, the battery voltage detection circuit 405 may be the processor of the portable electronic device 401. That is, in addition to transmitting the value of the battery voltage V_BAT to the control circuit 203, the battery voltage detection circuit 405 may be used to control other operations of the portable electronic device 401.

The control circuit 203 may control the input voltage supply circuit 201 to generate the input voltage V_in according to the received value of the battery voltage V_BAT. In the embodiment of FIG. 4, the input voltage supply circuit 201 obtains the power stored in the power supply battery 407 to generate the input voltage V_in. The charging circuit 205 receives the input voltage V_in and provides the charging current I_cha to charge the target battery 207. The input voltage V_in is generated according to a function which takes the battery voltage V_BAT as a parameter. The input voltage V_in is positively correlated with the battery voltage V_BAT, that is, when the battery voltage V_BAT becomes greater, the input voltage V_in will also become greater, wherein the input voltage V_in is larger than the battery voltage V_BAT. In this way, the voltage difference between the input voltage V_in and the battery voltage V_BAT may be reduced when the charging circuit 205 normally operates.

As can be seen from the above, if the voltage difference between the input voltage V_in and the battery voltage V_BAT drops, the power consumed by the charging circuit 205 may also become lower. Hence, under the situation where the power stored in the power supply battery 407 is finite, the lower the charging circuit 205 consumes the power, the more efficiently the power stored in the power supply battery 407 can be transferred to the target battery 207, thereby increasing upper limits of the times target battery 207 can be fully charged by the power supply battery 407 when the power supply battery 407 is in its full power.

According to the above-mentioned embodiments, the charging system provided by the present invention may reduce the voltage difference between the two ends of the charging circuit, and thereby reduces the power consumed by the charging circuit and the overheat problem of the charging circuit. When the charging system provided by the present invention is applied to a portable electronic system that comprises a battery box, the power stored in the battery box can be efficiently transferred to the battery to be charged, thus increasing the times the target battery can be fully charged by the battery box.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charging system comprising:
an input voltage supply circuit;
a control circuit, coupled to the input voltage supply circuit, and configured to control the input voltage supply circuit to generate an input voltage according to a battery voltage of a target battery; and
a charging circuit, coupled to the control circuit, and configured to receive the input voltage and to provide a charging current to charge the target battery, wherein the target battery receives the charging current;
wherein the input voltage is generated according to a function that takes the battery voltage as a parameter, and the input voltage is positively correlated with the battery voltage and is greater than the battery voltage;
wherein the function is represented as $V\_in = M \times V\_BAT + N \times R\_on \times I\_cha + K$, V_in is the input voltage, V_BAT is the battery voltage, R_on is an equivalent resistance of the charging circuit, and I_cha is the charging current, M and K are positive numbers;
wherein a difference between the input voltage and the battery voltage remains constant when the battery voltage is smaller than a threshold voltage, and becomes smaller and smaller when the battery voltage is greater than the threshold voltage.

2. The charging system according to claim 1, wherein the control circuit and the input voltage supply circuit are arranged in a battery box, the battery box further comprises a power supply battery, and the input voltage supply circuit obtains power stored in the power supply battery to generate the input voltage.

3. The charging system according to claim 2, wherein the charging circuit and the target battery are arranged in a portable electronic device.

4. The charging system according to claim 3, wherein the portable electronic device comprises a battery voltage detection circuit which is configured to transmit a value of the battery voltage to the control circuit.

5. The charging system according to claim 1, wherein the charging circuit is a switch charging circuit.

6. A portable electronic system, comprising:
a battery box, comprising:
an input voltage supply circuit;
a power supply battery, coupled to the input voltage supply circuit; and
a control circuit, coupled to the input voltage supply circuit, and configured to control the input voltage supply circuit to obtain power stored in the power supply battery to generate an input voltage according to the battery voltage of a target battery, wherein the target battery receives the charging current; and
a portable electronic device, comprising the target battery, and comprising:
a charging circuit, coupled to the control circuit, and configured to receive the input voltage and provide a charging current to charge the target battery;
wherein the input voltage is generated according to a function which takes the battery voltage as a parameter, and the input voltage is positively correlated with the battery voltage and the input voltage is greater than the battery voltage;
wherein the function is represented as $V\_in = M \times V\_BAT + N \times R\_on \times I\_cha + K$, V_in is the input voltage, V_BAT is the battery voltage, R_on is an equivalent resistance of the charging circuit, and I_cha is the charging current, M and K are positive numbers;
wherein a difference between the input voltage and the battery voltage remains constant when the battery voltage is smaller than a threshold voltage, and becomes smaller and smaller when the battery voltage is greater than the threshold voltage.

7. The portable electronic system according to claim 6, wherein the portable electronic device further comprises a battery voltage detection circuit which is configured to transmits a value of the battery voltage to the control circuit.

8. The portable electronic system according to claim 6, wherein the charging circuit is a switch charging circuit.

* * * * *